US007466552B2

(12) United States Patent
Shin

(10) Patent No.: US 7,466,552 B2
(45) Date of Patent: Dec. 16, 2008

(54) HEAT-RADIATING STRUCTURE AND PLASMA DISPLAY DEVICE INCLUDING THE SAME

(75) Inventor: Dong-Hyok Shin, Suwon-si (KR)

(73) Assignee: Samsung SDI Co., Ltd., Suwon-si, Gyeonggi-do (KR)

(*) Notice: Subject to any disclaimer, the term of this patent is extended or adjusted under 35 U.S.C. 154(b) by 86 days.

(21) Appl. No.: 11/605,271

(22) Filed: Nov. 29, 2006

(65) Prior Publication Data

US 2007/0127208 A1    Jun. 7, 2007

(30) Foreign Application Priority Data

Dec. 5, 2005    (KR) .................. 10-2005-0117684

(51) Int. Cl.
*H05K 7/20* (2006.01)
(52) U.S. Cl. .............. 361/707; 361/681; 361/703; 361/704; 361/715; 165/80.3; 165/104.33; 165/185; 359/885; 349/58; 313/582
(58) Field of Classification Search ............. 361/681, 361/683, 688–690, 701–714, 719, 800, 816, 361/831; 165/80.3, 80.4, 104.33, 104.34, 165/185; 313/33, 40–48, 493, 573, 582, 313/634, 294, 581, 583; 349/58–60
See application file for complete search history.

(56) References Cited

U.S. PATENT DOCUMENTS 6,323,891 B1 * 11/2001 Kitani et al. ............... 347/263

| 7,064,952 | B1 * | 6/2006 | Chen et al. | 361/681 |
| 7,345,878 | B2 * | 3/2008 | Kim | 361/703 |
| 2005/0088092 | A1 * | 4/2005 | Kim et al. | 313/582 |
| 2006/0132946 | A1 * | 6/2006 | Kim et al. | 359/885 |
| 2006/0181853 | A1 * | 8/2006 | Jeong | 361/704 |
| 2006/0227511 | A1 * | 10/2006 | Jeong | 361/715 |
| 2006/0262241 | A1 * | 11/2006 | Jeong | 349/58 |

FOREIGN PATENT DOCUMENTS

| KR | 2001016902 A | * | 5/2001 |
| KR | 2006060958 A | * | 6/2006 |
| KR | 2006084757 A | * | 7/2006 |

* cited by examiner

*Primary Examiner*—Michael V Datskovskiy
(74) *Attorney, Agent, or Firm*—Robert E. Bushnell, Esq.

(57) ABSTRACT

In a heat-radiating structure and a plasma display device including the same, an uneven shape is formed in a bed of a chassis base, and a heat sink is installed on a cover plate such that heat is radiated toward both sides of the cover plate. The heat-radiating structure includes: a signal transmission unit to which an integrated circuit is attached; a chassis having a bed for supporting the signal transmission unit formed therein; and a cover plate which covers the signal transmission unit and having a heat sink formed therein. The plasma display device includes: a plasma display panel for realizing an image by exciting a phosphor using a gas discharge; a signal processing unit for converting image data inputted from an external source into a driving signal for driving the plasma display panel; a signal transmission unit which transmits the driving signal to the plasma display panel, and to which the above-described integrated circuit is driven is attached; a chassis which supports the plasma display panel and having the above-described bed formed therein; and a cover plate as described above.

14 Claims, 4 Drawing Sheets

HEAT-RADIATING STRUCTURE AND PLASMA DISPLAY DEVICE INCLUDING THE SAME

CLAIM OF PRIORITY

This application makes reference to, incorporates the same herein, and claims all benefits accruing under 35 U.S.C. §119 from an application for HEAT-RADIATING STRUCTURE AND PLASMA DISPLAY DEVICE COMPRISING THE SAME earlier filed in the Korean Intellectual Property Office on the 5$^{th}$ of Dec. 2005 and there duly assigned Serial No. 10-2005-0117684.

BACKGROUND OF THE INVENTION

1. Technical Field

The present invention relates to a heat-radiating structure and a plasma display device including the same and, more particularly, to a heat-radiating structure in which an uneven shape is formed and a heat sink is additionally installed to improve heat-radiating efficiency.

2. Related Art

A plasma display device is a type of flat display. A schematic structure of the plasma display device and a principle for driving the same are as follows: a discharge gas is sealed between substrates on which a plurality of discharge electrodes are formed, a discharge voltage is applied, phosphor is formed in a predetermined pattern by ultraviolet rays generated by the discharge voltage, and the phosphor is excited whereby a desired image is obtained.

Plasma display devices can be manufactured with a small thickness of less than several centimeters. In plasma display devices, a large screen can be realized and a view angle greater than 150° is wide. Thus, plasma display devices have recently replaced previous display devices.

A plasma display device includes a plasma display panel (PDP) in which an image is realized, a chassis base which is substantially parallel to the PDP, a driving circuit board which is disposed behind the chassis base and which drives the PDP, a front cover in which the PDP, the chassis base and the driving circuit board are accommodated, and a back cover.

In the plasma display device, a signal transmission means, such as a tape carrier package (TCP), is widely used to transmit an electrical signal processed by the driving circuit board to the PDP. The TCP includes integrated circuit (IC) chips and a flexible interconnection portion combined with the IC chips. The TCP is formed in a tape shape and thus has flexibility. In addition, a plurality of elements can be mounted on the TCP, and thus, the size of the driving circuit board can be reduced so that the TCP is widely used.

The TCP is protected by a cover plate. The cover plate is combined with the chassis base using a plurality of screws. At this point, the cover plate pressurizes the TCP so that heat generated in the IC chips when they are driven can be smoothly radiated. The combination of the IC chips with the TCP is small, approximately 2 mm×6 mm. However, a large amount of heat is generated in the IC chips when they are driven. Since the TCP is closely adhered to the chassis base using the cover plate, heat generated in the IC chips is radiated toward the chassis base. The chassis base is generally formed of a metallic material, such as aluminum (Al), having high thermal conductivity. However, a chassis base formed of plastic having low cost and excellent processibility is widely used.

When the chassis base formed of plastic is used, heat radiation toward the chassis base is not smoothly performed. Thus, most of the heat generated in the IC chips should be radiated toward the cover plate.

However, since the cover plate is a simple planar shape or a simply bent plate having an "L" shaped cross section, the cover plate has a poor heat-radiating performance. Thus, in this case, a large amount of heat generated in the IC chips is not smoothly radiated, which causes a malfunction.

SUMMARY OF THE INVENTION

The present invention provides a heat-radiating structure and a plasma display device having the same, wherein an uneven shape is formed at a bed of a chassis base, and a heat sink is installed on a cover plate such that heat is radiated toward both sides of the cover plate.

According to an aspect of the present invention, the heat-radiating structure comprises: a signal transmission unit to which an integrated circuit, in which heat is generated when it is driven, is attached; a chassis in which a bed for supporting the signal transmission unit is formed; and a cover plate which covers the signal transmission unit and in which a heat sink is formed.

The heat sink of the cover plate is preferably formed on a surface opposing the signal transmission unit.

The heat sink preferably has a plate shape and protrudes from the cover plate.

An uneven portion is preferably formed in the bed so that a space in which the heat sink is to be disposed can be formed.

A part of the bed is preferably cut so that a space in which the heat sink is to be disposed can be formed.

The chassis is preferably formed of plastic or metal.

The cover plate is preferably formed of a material including aluminum or copper.

According to another aspect of the present invention, a plasma display device comprises: a plasma display panel for realizing an image by exciting a phosphor using a gas discharge; a signal processing unit for processing image data inputted from an external source, and for converting the image data to a driving signal for driving the plasma display panel; a signal transmission unit which transmits the driving signal to the plasma display panel, and to which an integrated circuit in which heat is generated when it is driven is attached; a chassis which supports the plasma display panel, and in which a bed for supporting the signal transmission unit is formed; and a cover plate which covers the signal transmission unit, and in which a heat sink is formed.

The heat sink of the cover plate is preferably formed on a surface opposing the signal transmission unit.

The heat sink preferably has a plate shape protruding from the cover plate.

An uneven portion is preferably formed in the bed so that a space in which the heat sink is to be disposed can be formed.

A part of the bed is preferably cut so that a space in which the heat sink is to be disposed can be formed.

The chassis is preferably formed of plastics or metal.

The cover plate is preferably formed of a material including aluminum or copper.

In the heat-radiating structure and the plasma display device including the same according to the present invention, heat conducted from the IC chips is preferably radiated only using the heat sink formed on the cover plate so that heat-radiating performance is improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
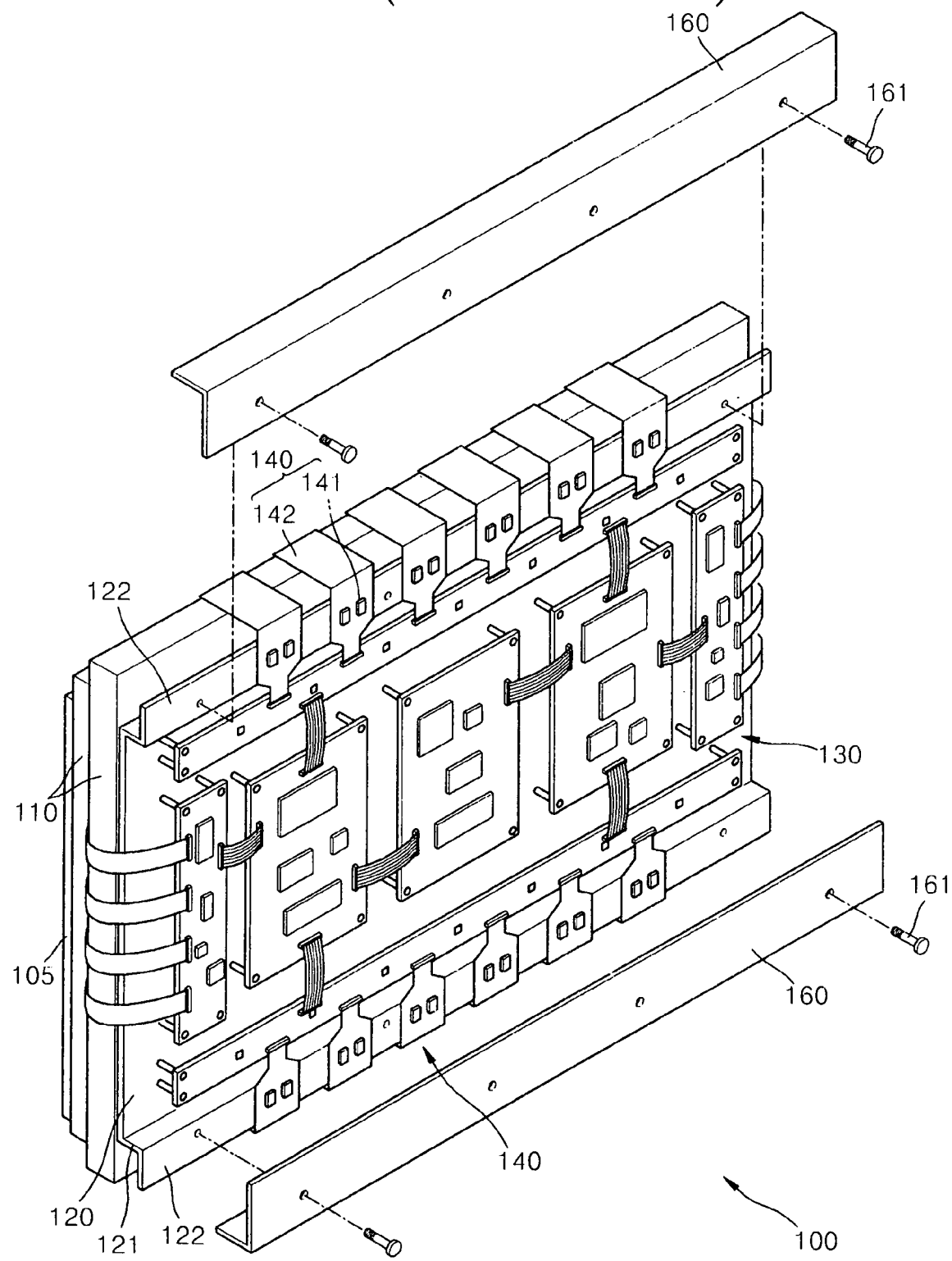
FIG. 1 is an exploded perspective view of a plasma display device.

FIG. 1 is an exploded perspective view of a plasma display device.

Referring to FIG. 1, a plasma display device 100 includes a plasma display panel (PDP) 110 in which an image is realized, a chassis base 120 which is substantially parallel to the PDP 110, a driving circuit board 130 which is disposed behind the chassis base 120 and which drives the PDP 110, a front cover (not shown) in which the PDP 110, the chassis base 120 and the driving circuit board 130 are accommodated, and a back cover (not shown).

In the plasma display device, a signal transmission means 140 such as a tape carrier package (TCP) is widely used to transmit an electrical signal processed by the driving circuit board 130 to the PDP 110. The TCP 140 includes integrated circuit (IC) chips 141 and a flexible interconnection portion 142 combined with the IC chips 141. The TCP 140 is formed in a tape shape, and thus it has flexibility. In addition, a plurality of elements can be mounted on the TCP 140, and thus, the size of the driving circuit board 130 can be reduced and the TCP 140 is widely used.

The TCP 140 is protected by a cover plate 160. The cover plate 160 is combined with the chassis base 120 using a plurality of screws 161. At this point, the cover plate 160 pressurizes the TCP 140 so that heat generated in the IC chips 141 when they are driven can be smoothly radiated. The combination of the IC chips 141 with the TCP 140 is small, approximately 2 mm×6 mm. However, a large amount of heat is generated in the IC chips 141 when they are driven. Since the TCP 140 is closely adhered to the chassis base 120 using the cover plate 160, heat generated in the IC chips 141 is radiated toward the chassis base 120. The chassis base 120 is generally formed of a metallic material, such as aluminum (Al), having high thermal conductivity. However, the chassis base 120 can be formed of plastic having low cost and excellent processibility, and this is widely used.

When the chassis base 120 formed of plastic is used, heat radiation toward the chassis base 120 is not smoothly performed. Thus, most of the heat generated in the IC chips 141 should be radiated toward the cover plate 160.

However, since the cover plate 160 has a simple planar shape or is a simply bent plate having an "L" shaped cross section, as illustrated in FIG. 1, the cover plate 160 has a poor heat-radiating performance. Thus, in this case, a large amount of heat generated in the IC chips 141 is not smoothly radiated, which causes a malfunction.

Figure 2:
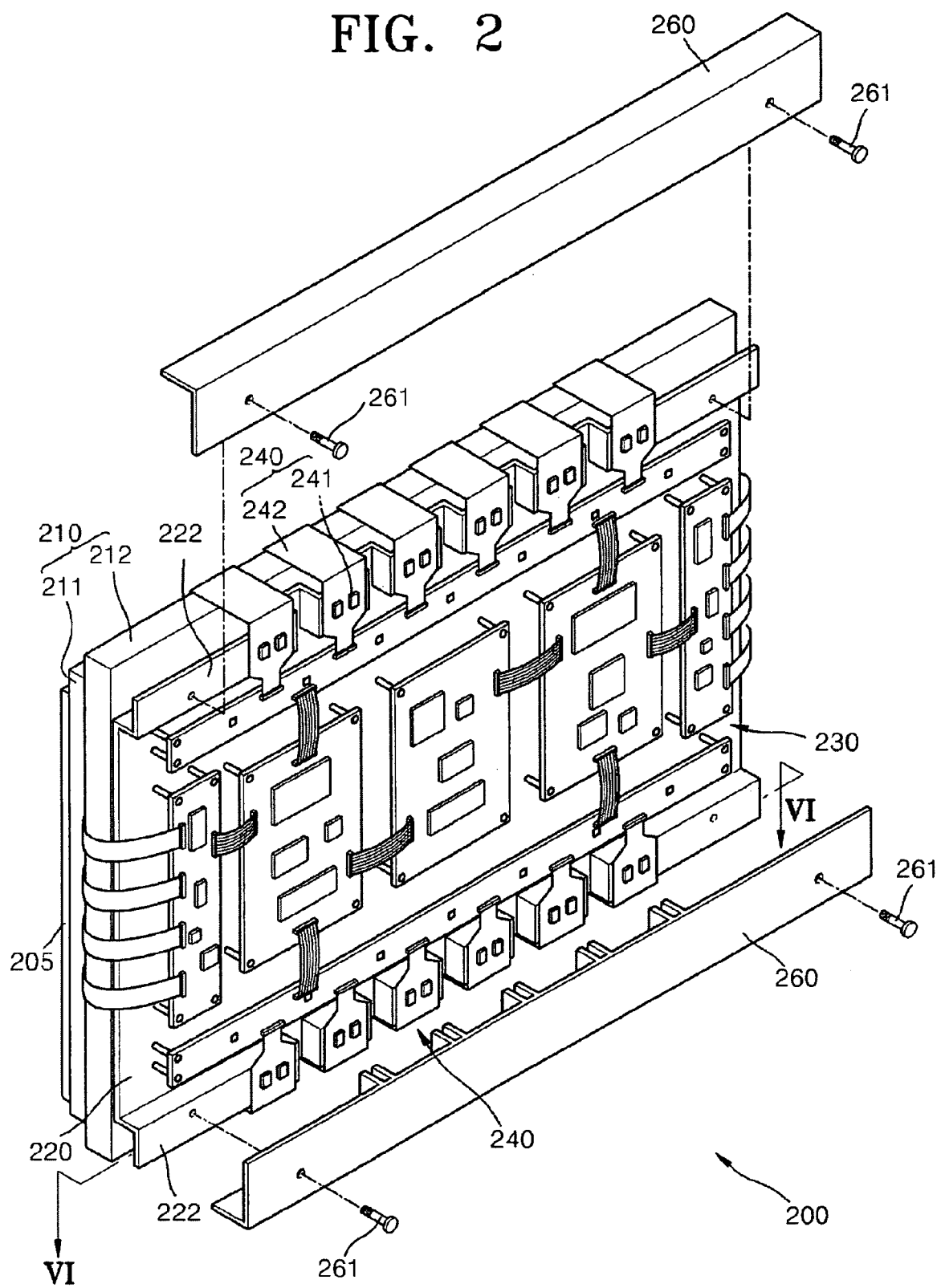
FIG. 2 is an exploded perspective view of a plasma display device according to an embodiment of the present invention.

FIG. 2 is an exploded perspective view of a plasma display device according to an embodiment of the present invention.

The plasma display device 200 of FIG. 2 includes a heat-radiating structure according to an embodiment of the present invention. Referring to FIG. 2, the plasma display device 200 includes a filter 205, a plasma display panel (PDP) 210, a chassis 220, a signal processing unit 230, a signal transmission unit 240, and a cover plate 260, and will now be described in detail.

The plasma display device 200 includes the PDP 210 in which an image is realized. The PDP 210 includes a front panel 211 and a rear panel 212.

One of various PDPs may be used as the PDP 210. As an example thereof, an AC surface discharge type PDP includes a front panel and a rear panel combined with the front panel. The front panel includes a front substrate, a plurality of sustain electrode pairs formed on the front substrate, a front dielectric layer in which the sustain electrode pairs are filled, and a protective layer which covers the front dielectric layer. The rear panel includes: a rear substrate; a plurality of address electrodes formed on the rear substrate so as to cross the sustain electrode pairs; a rear dielectric layer in which the address electrodes are filled; barrier ribs which are formed between the front dielectric layer and the rear dielectric layer, and which define a discharge space and prevent electrical and optical cross-talk; and red, green and blue phosphor layers which are disposed inside the discharge space partitioned by the barrier ribs, and which produce red, green, and blue light. A discharge gas including an inert gas, such as Xe or Ar, is filled in the discharge space.

A filter 205, including an electromagnetic wave shielding layer for shielding electromagnetic waves which are generated when the PDP 210 is driven and which are harmful to the human body, may be installed on a front surface of the PDP 210.

The PDP 210 is supported by the chassis 220 disposed behind the PDP 210. The PDP 210 and the chassis 220 are combined with each other using an adhesive member (not shown), such as a dual adhesive tape. The chassis 220 supports the PDP 210, and radiates heat generated and conducted in the PDP 210. Besides the adhesive member, a heat conductive medium (not shown) may be disposed between the PDP 210 and the chassis 220. Heat generated from the PDP 210 can be more rapidly transmitted to the chassis 220 using the heat conductive medium.

Beds 222 are respectively formed above and below the chassis 220. The beds 222 reinforce rigidity of the chassis 220 and provide a space for supporting the signal transmission unit 240. The beds 222 constitute protruding portions when an end part of the chassis 220 is bent at two stages and a plurality of uneven portions are formed in the bent end part of the chassis 220. According to the current embodiment of the present invention, the end part of the chassis has a sequentially two-stage-bent shape so that rigidity of the chassis 220 can be reinforced and heat generated in the PDP 210 can be prevented from being directly transmitted to the signal transmission unit 240. However, the present invention is not limited to this, and the end part of the chassis 220 may have another shape, for example, the shape of a square cross section. In order to provide a space in which a heat sink of the cover plate 260, which will be described later, is to be disposed, an uneven portion or a cutting portion should be formed at the end part of the chassis 220. The shape of the end part of the chassis 220, including the beds 222, will be described later in greater detail.

The signal processing unit 230 is installed behind the combination of the chassis 220 and the PDP 210. The signal processing unit 230 includes circuit boards which processes an image signal inputted from an external source so as to convert the images signal into a signal for driving the PDP 210. Elements for driving the PDP 210 are mounted on the circuit boards. The signal processing unit 230 includes a power supply for supplying power to the PDP 210, for example, a switching mode power supply (SMPS), and a driver for applying an image-realizing signal to the PDP 210. The PDP 210, the chassis 220, and the signal processing unit 230 are accommodated in a front cover (not shown) and a back cover (not shown).

The signal processing unit 230 transmits an electrical signal to the PDP 210 using the signal transmission unit 240. A tape carrier package (TCP) or a chip on film (COF) may be used as the signal processing unit 230. According to the embodiment of the present invention, a TCP 240 in which one or more integrated circuit (IC) chips 241 are mounted on a flexible interconnection portion 242 having a tape shape so as to form a package is used. Hereinafter, the signal transmission unit 240 is presumed to be a TCP. However, the signal transmission unit 240 is not limited to a TCP.

The signal transmission unit 240 passes through an edge of the chassis 220, one end of the signal transmission unit 240 being coupled with the PDP 210 and the other end thereof being coupled with the signal processing unit 230. In this regard, the signal transmission unit 240 corresponds to the bed 222 of the chassis 220.

The signal transmission unit 240 is protected by the cover plate 260. The cover plate 260 is combined with the chassis 220 using a plurality of screws 261. The shape and feature of the cover plate 260 will be described later in greater detail with reference to FIG. 5.

Figure 3:
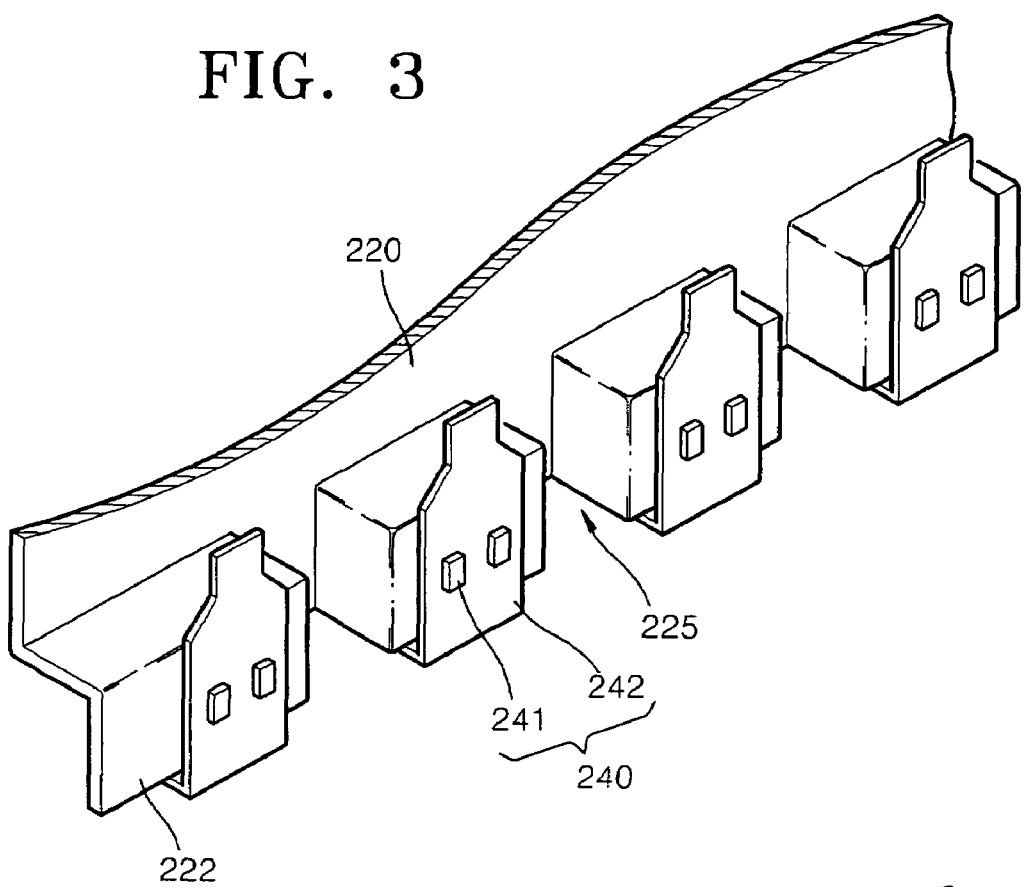
FIG. 3 illustrates an example of a signal transmission unit and a bed of a chassis for supporting the signal transmission unit of the plasma display device illustrated in FIG. 2.

FIG. 3 illustrates an example of a signal transmission unit and a bed of a chassis for supporting the signal transmission unit of the plasma display device illustrated in FIG. 2.

The shape of the bed which is one feature of the present invention will now be described in detail with reference to FIG. 3. As seen in FIG. 3, the signal transmission unit 240 (that is, the TCP 240) and the bed 222 of the chassis 220 support the TCP 240 of the PDP 210 illustrated in FIG. 2. Further referring to FIG. 3, an uneven portion is formed at an end part of the chassis 220 and the bed 222 is formed therein. A depression 225 of the uneven portion provides a space in which a heat sink can be disposed when the cover plate 260 having the heat sink is combined with the chassis 220. In addition, the uneven portion is formed in this way so that the heat-radiating area is increased and heat-radiating efficiency is improved. The uneven portion corresponds to the heat sink of the cover plate 260 which will be described later, and the shape, position, and number of uneven portions may be changed by the number, length and shape of heat sinks formed on the cover plate. The uneven portions may be formed using injection molding and press working at the chassis 220 formed of a metallic material, such as aluminum (Al) or plastic.

Figure 4:
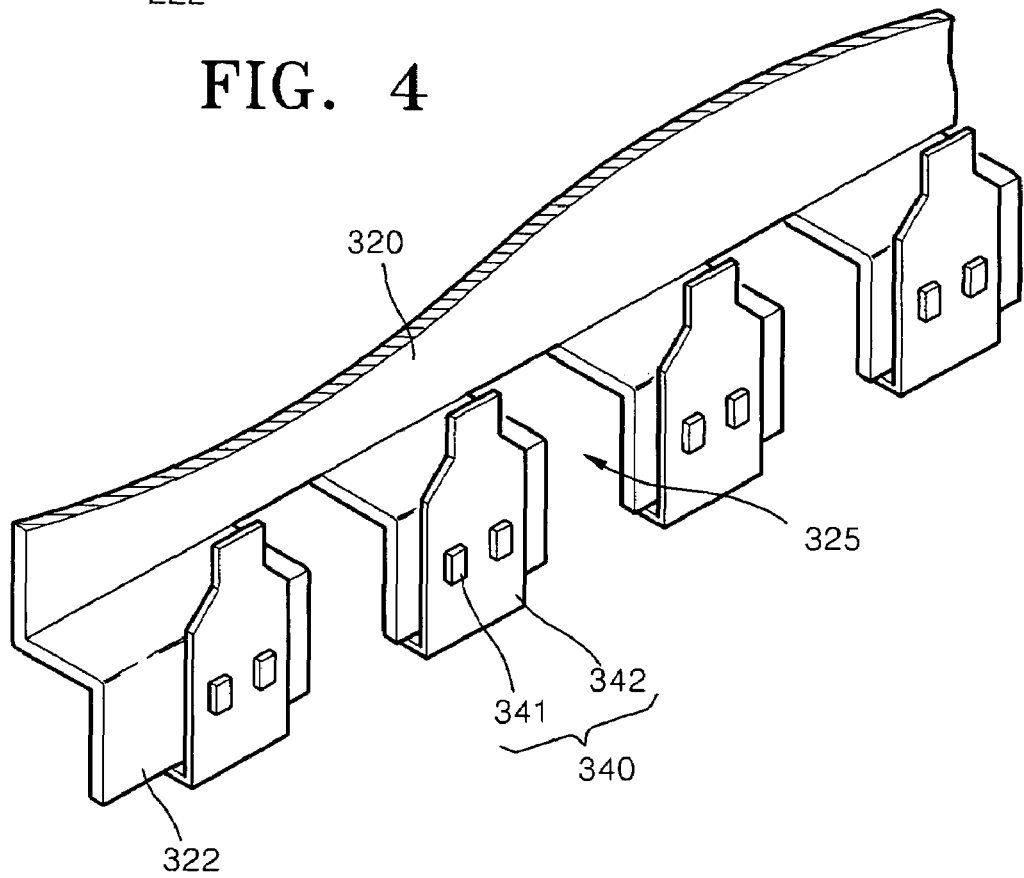
FIG. 4 illustrates another modified example of a signal transmission unit and a bed of a chassis for supporting the signal transmission unit of the plasma display device illustrated in FIG. 2.

FIG. 4 illustrates another modified example of a signal transmission unit and a bed of a chassis for supporting the signal transmission unit of the plasma display device illustrated in FIG. 2.

A bed 322 has the same basic structure in which an end part of the chassis 320 is bent at two stages, as was the case in FIG. 3. There is one a difference between FIGS. 3 and 4 in that an uneven portion forms the bed 222 of FIG. 3, while a cutting portion 325 in which a predetermined end part of the chassis 320 is cut forms the bed 322 of FIG. 4. The bed 322 provides a space for supporting the signal transmission unit 340 as was the case with the bed 222 in FIG. 3. The signal transmission unit 340 is a TCP including IC chips 341 and an interconnection portion 342.

In the modified example of FIG. 4, cutting of a space between the beds 322 can be more easily performed than can the formation of the uneven portion illustrated in FIG. 3. Even when a chassis formed of a metallic material having a large thickness in which injection molding cannot be performed or a brittle metallic material is used, cutting and bending processes are combined with each other so that the shape illustrated in FIG. 4 can be obtained.

Figure 5:
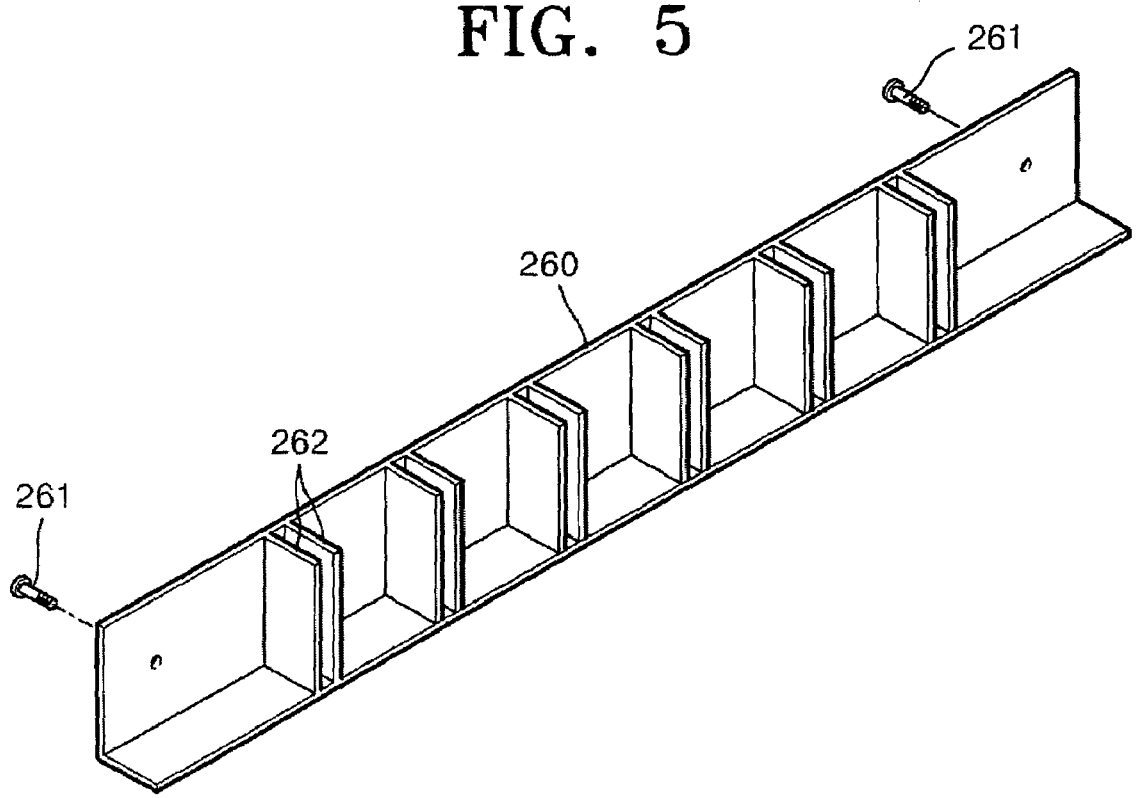
FIG. 5 illustrates a cover plate of the plasma display device illustrated in FIG. 2.

FIG. 5 illustrates a cover plate of the plasma display device illustrated in FIG. 2.

More specifically, FIG. 5 shows the shape of the cover plate 260 of the PDP 210 illustrated in FIG. 2. The cover plate 260 is also a part of the heat-radiating structure according 2 to an embodiment of the present invention. The cover plate 260 of FIG. 5 can be applied to the example in which the uneven portion is formed, as illustrated in FIG. 3, and to the modified example in which the space between the beds 322 is cut, as illustrated in FIG. 4. As illustrated in FIG. 5, a heat sink 262 having a protruding plate shape is formed in the cover plate 260. The shape of the heat sink 262 is not limited to a plate shape and the heat sink 262 may have different shapes. In addition, according to the current embodiment of the present invention, a pair of heat sinks 262 is formed. However, the present invention is not limited to this, and the number of heat sinks 262 may vary.

The cover plate 260 protects the signal transmission unit 240, and simultaneously absorbs and radiates heat generated in the signal transmission unit 240. The cover plate 260 is combined with the chassis 220 using the screws 261. The heat sinks 262 formed in the cover plate 260 correspond to spaces 225 and 325 between the beds 222 and 322 of FIG. 3 and FIG. 4, respectively. According to the current embodiment of the present invention, two heat sinks 262 correspond to one space between the beds. However, the present invention is not limited to this, and the number and shape of the heat sinks 262 may be changed if necessary.

Figure 6:
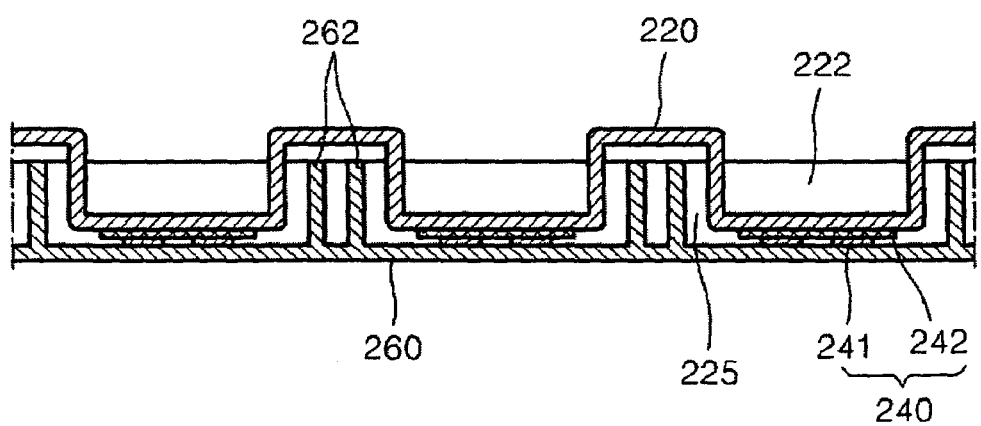
FIG. 6 is a cross-sectional view taken along line VI-VI of FIG. 2.

FIG. 6 is a cross-sectional view taken along line VI-VI of FIG. 2. That is, FIG. 6 illustrates the state in which the signal transmission unit 240, the beds 222 of the chassis 220, and the cover plate 260 are combined with one another in the PDP 210 illustrated in FIG. 2.

As described above, the beds 222 are formed at the end part of the chassis 220 using an uneven portion, and the beds 222 support the signal transmission unit 240 including the IC chips 241 and the interconnection portion 242. The cover plate 260 pressurizes the signal transmission unit 240 so that the signal transmission unit 240 can be closely adhered to the bed 222 of the chassis 220. Although not shown in FIG. 6, the cover plate 260 is combined with other elements using the chassis 220 and the screws 261 or other combining means. Since the IC chips 241 are mounted on the signal transmission unit 240 and protrude, a heat conductive pad (not shown) formed of polymer or silicon may be further disposed between the IC chips 241 and the cover plate 260. As such, when the cover plate 260 formed of aluminum (Al) having a hard structure (generally, Brinell hardness of 100 degrees more) or an alloy thereof directly contacts the IC chips 241, the IC chips 241 can be prevented from being damaged when the display module equipped with the cover plate 260 is assembled with other elements.

Since a plurality of heat sinks 262 is formed in the cover plate 260 so as to be disposed between signal transmission units 240, heat is briskly radiated from both sides of the cover plate 260. A conventional cover plate has a simple planar shape and heat conducted from the IC chips 241 can be radiated only in the backward direction. Conversely, according to the current embodiment of the present invention, heat radiated from the IC chips 241 by convection is absorbed and radiated by the heat sinks 262 so that heat-radiating efficiency is improved. This is because, when the chassis 220 is formed of plastic and the heat-radiating effect toward the chassis 220 is low, the heat-radiating structure according to the present invention is a more effective heat-radiating unit.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A heat-radiating structure, comprising:
    a signal transmission unit where an integrated circuit, in which heat is generated when the integrated circuit is driven, is electrically coupled and physically attached;
    a chassis having a bed for supporting the signal transmission unit physically coupled with the bed of the chassis;
    a cover plate which covers the signal transmission unit, and has at least one heat sink formed in the cover plate; and
    each at least one heat sink being inserted into each of at least one separated space formed in the bed.

2. The heat-radiating structure of claim 1, wherein the at least one heat sink of the cover plate is formed on a surface facing and opposing the signal transmission unit.

3. The heat-radiating structure of claim 1, wherein the at least one heat sink has a plate shape and protrudes from the cover plate toward the chassis.

4. A heat-radiating structure, comprising:
    a signal transmission unit to which an integrated circuit, in which heat is generated when the integrated circuit is driven, is attached;
    a chassis having a bed for supporting the signal transmission unit formed therein; and
    a cover plate which covers the signal transmission unit, and having a heat sink formed therein,
    wherein an uneven portion is formed in the bed so that a space in which the heat sink is to be disposed is formed.

5. A heat-radiating structure, comprising:
    a signal transmission unit to which an integrated circuit, in which heat is generated when the integrated circuit is driven, is attached;
    a chassis having a bed for supporting the signal transmission unit formed therein; and
    a cover plate which covers the signal transmission unit, and having a heat sink formed therein,
    wherein a part of the bed is cut so that a space in which the heat sink is to be disposed is formed.

6. The heat-radiating structure of claim 1, wherein the chassis is formed of one of plastic and metal.

7. The heat-radiating structure of claim 1, wherein the cover plate is formed of one of aluminum and copper.

8. A plasma display device, comprising:
    a plasma display panel for realizing an image by exciting a phosphor using a gas discharge;
    a signal processing unit for processing image data received from an external source, and for converting the image data to a driving signal for driving the plasma display panel;
    a signal transmission unit which transmits the driving signal to the plasma display panel, and where an integrated circuit, in which heat is generated when the integrated circuit is driven, is electrically coupled and physically attached;
    a chassis which supports the plasma display panel and having a bed for supporting the signal transmission unit physically coupled with the bed of the chassis;
    a cover plate which covers the signal transmission unit, and has at least one heat sink formed in the cover plate; and
    each at least one heat sink being inserted into each of at least one separated space formed in the bed.

9. The plasma display device of claim 8, wherein the at least one heat sink of the cover plate is formed on a surface facing and opposing the signal transmission unit.

10. The plasma display device of claim 8, wherein the at least one heat sink has a plate shape and protrudes from the cover plate toward the chassis.

11. A plasma display device, comprising:
    a plasma display panel for realizing an image by exciting a phosphor using a gas discharge;
    a signal processing unit for processing image data inputted from an external source, and for converting the image data to a driving signal for driving the plasma display panel;
    a signal transmission unit which transmits the driving signal to the plasma display panel, and to which an integrated circuit, in which heat is generated when the integrated circuit is driven, is attached;
    a chassis which supports the plasma display panel and having a bed for supporting the signal transmission unit formed therein; and
    a cover plate which covers the signal transmission unit, and has a heat sink formed therein,
    wherein an uneven portion is formed in the bed so that a space in which the heat sink is to be disposed is formed.

12. A plasma display device, comprising:
    a plasma display panel for realizing an image by exciting a phosphor using a gas discharge;
    a signal processing unit for processing image data inputted from an external source, and for converting the image data to a driving signal for driving the plasma display panel;
    a signal transmission unit which transmits the driving signal to the plasma display panel, and to which an integrated circuit, in which heat is generated when the integrated circuit is driven, is attached;
    a chassis which supports the plasma display panel and having a bed for supporting the signal transmission unit formed therein; and
    a cover plate which covers the signal transmission unit, and having a heat sink formed therein,
    wherein a part of the bed is cut so that a space in which the heat sink is to be disposed is formed.

13. The plasma display device of claim 8, wherein the chassis is formed of one of plastic and metal.

14. The plasma display device of claim 8, wherein the cover plate is formed of one of aluminum and copper.

* * * * *